US008779552B2

(12) United States Patent
Fornara et al.

(10) Patent No.: US 8,779,552 B2
(45) Date of Patent: Jul. 15, 2014

(54) INTEGRATED CIRCUIT CHIP PROTECTED AGAINST LASER ATTACKS

(75) Inventors: Pascal Fornara, Pourrieres (FR); Fabrice Marinet, Chateauneuf le Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 7 days.

(21) Appl. No.: 12/897,231

(22) Filed: Oct. 4, 2010

(65) Prior Publication Data

US 2011/0079881 A1 Apr. 7, 2011

(30) Foreign Application Priority Data

Oct. 5, 2009 (FR) .................................... 09 56923

(51) Int. Cl.
*H01L 29/72* (2006.01)
(52) U.S. Cl.
USPC ....... 257/617; 257/59; 257/629; 257/E29.107
(58) Field of Classification Search
USPC ............... 257/617, E29.107, 58, 59, 107, 629
See application file for complete search history.

(56) References Cited

U.S. PATENT DOCUMENTS

| 4,203,780 | A * | 5/1980 | Matsushita et al. ........... 438/530 |
| 6,709,512 | B2 * | 3/2004 | Yamoto et al. .................. 117/90 |
| 6,919,618 | B2 | 7/2005 | Aumuller et al. |
| 2003/0057522 | A1 | 3/2003 | Francis et al. |
| 2005/0012098 | A1 * | 1/2005 | Satou et al. ...................... 257/59 |
| 2005/0040500 | A1 | 2/2005 | Henmi |
| 2006/0264068 | A1 | 11/2006 | Yoneda |
| 2008/0138963 | A1 * | 6/2008 | Yamazaki et al. ............. 438/471 |
| 2008/0286944 | A1 | 11/2008 | Thill |
| 2009/0102024 | A1 * | 4/2009 | Takahi et al. .................. 257/629 |

FOREIGN PATENT DOCUMENTS

| DE | 100337256 A1 | 6/2004 |
| JP | 11250215 A | 9/1999 |

OTHER PUBLICATIONS

French Search Report dated May 12, 2010 from corresponding French Application No. 09/56923.
French Search Report dated May 12, 2010 from related French Application No. 09/56920.
Binns M.J., *Effective Intrinsic Gettering for 200MM and 300 MM P/P-Wafers in a Low Thermal Budget 0.13 m Advanced CMOS Logic Process*, 9th Int. Symmp. Silicon Materials Science & Technology, Philadelphia, May 12-17, 2002,; XP002581984.
Office Action dated Dec. 29, 2011 for U.S. Appl. No. 12/897,217, filed Oct. 4, 2010.
Office Action from U.S. Appl. No. 12/897,217, dated Jul. 2, 2012.

* cited by examiner

*Primary Examiner* — Edward Wojciechowicz
(74) *Attorney, Agent, or Firm* — Wolf, Greenfield & Sacks, P.C.

(57) ABSTRACT

An integrated circuit chip formed inside and on top of a semiconductor substrate and including: in the upper portion of the substrate, an active portion in which components are formed; and under the active portion and at a depth ranging between 5 and 50 μm from the upper surface of the substrate, an area comprising sites for gettering metal impurities and containing metal atoms at a concentration ranging between $10^{17}$ and $10^{18}$ atoms/cm$^3$.

25 Claims, 2 Drawing Sheets

INTEGRATED CIRCUIT CHIP PROTECTED AGAINST LASER ATTACKS

CROSS REFERENCE TO RELATED APPLICATIONS

This application claims the priority benefit of French patent application Ser. No. 09/56923, filed on Oct. 5, 2009, entitled "Integrated Circuit Chip Protected Against Laser Attacks," which is hereby incorporated by reference to the maximum extent allowable by law.

BACKGROUND OF THE INVENTION

1. Field of the Invention

The present invention relates to the protection of an integrated circuit chip against laser attacks.

2. Discussion of the Related Art

FIG. 1 is a simplified cross-section view of an integrated circuit chip 1 formed inside and on top of a semiconductor substrate 3. Substrate 3 comprises, in its upper portion, an active layer 5, presently an epitaxial layer, in which are formed electronic components, not shown. Presently, active layer 5 is covered with a stack of insulating layers 7 and of conductive interconnect tracks 9. Several successive interconnect levels are generally provided. Conductive vias, not shown, cross the insulating layers to connect the conductive tracks together, to input-output terminals 11 of the chip, and to components of active layer 5, thus forming the circuit interconnections.

In certain devices, for example, secure components such as payment cards, regions of active area 5 are capable of processing and/or of storing critical data, for example, ciphering keys. Such devices may undergo a tampering aiming at obtaining protected confidential data.

Among known attacks, so-called "fault attacks" comprise deliberately disturbing the operation of a chip, and analyzing the influence of disturbances on its operation. The attacker especially studies the influence of disturbances on data such as output signals, the consumption, or response times. He is likely to deduce therefrom, by statistic studies or others, critical data such as the algorithms used and, possibly, ciphering keys.

To deliberately cause faults in the circuits of a chip, an attack mode comprises bombarding local areas of the chip with a laser beam. Fault can thus be injected into certain memory cells and/or the behavior of certain components may be altered. It should be noted that in a laser attack, the chip needs to be powered.

Due to the presence of the metal interconnect tracks on the front surface side of the substrate, laser attacks are, in many cases, performed on the back side of the chip. Indeed, on the front surface side, the probability for a laser beam to reach a component through the tangle of metal tracks is close to zero. Further, the attacker cannot afford to remove the interconnect levels since this would make the chip inoperative and impossible to analyze.

FIG. 2 is a simplified cross-section view of chip 1 illustrating a preliminary thinning-down step of substrate 3, frequently implemented before a back-side laser attack. Such a step improves the efficiency of the laser attack by reducing the beam attenuation by the substrate. To make the components of active region 5 accessible to the laser beam, the attacker needs to remove a portion of the thickness of substrate 3 from its lower surface or back side. As an example, a chip formed from a substrate having a 180-μm thickness will undergo a thickness decrease on the order of 130 μm before a laser attack.

To be protected against frauds, an attack detection device, coupled to a protection circuit, is generally provided in secure chips. When an attack is detected, the protection circuit implements measures of protection, alienation, or destruction of the critical data. For example, it may be provided, when an attack is detected, to interrupt the power supply of the chip or to reset the chip, to reduce the time during which the attacker may examine the chip response to a disturbance.

Attack detection solutions may be logical. They, for example, comprise regularly introducing, into the calculations, integrity tests enabling to make sure that the data are not being modified. Such solutions have the disadvantage of introducing additional calculation steps, thus increasing the chip response times. Further, integrity tests may not detect all the disturbances caused by an attacker. The latter thus has some room for maneuver that can enable him to acquire critical data.

Other so-called physical attack detection solutions especially comprise sensors sensitive to temperature variations, to ultraviolet rays, or to X rays, enabling to detect suspicious activities. Like logic solutions, such solutions are not perfectly reliable. Indeed, before the attack is detected, the attacker has room for maneuver to obtain critical data. Further, the implementation of such solutions is complex and increases the silicon surface area necessary to form the chip.

SUMMARY OF THE INVENTION

An object of an embodiment of the present invention is to provide a system for protecting an integrated circuit chip against laser attacks, which overcomes at least some of the disadvantages of prior art solutions.

An object of an embodiment of the present invention is to provide such a system, which can reinforce or even replace prior art solutions.

An object of an embodiment of the present invention is to provide such a system enabling to prevent the attacker from obtaining critical data before the attack is detected by usual means.

Thus, an embodiment of the present invention provides an integrated circuit chip formed inside and on top of a semiconductor substrate and comprising: in the upper portion of the substrate, an active portion in which components are formed; and under the active portion and at a depth ranging between 5 and 50 μm from the upper surface of the substrate, an area comprising sites for gettering metal impurities and containing metal atoms at a concentration ranging between $10^{17}$ and $10^{18}$ atoms/cm$^3$.

According to an embodiment of the present invention, the gettering sites result from an implantation of a rare gas followed by an anneal.

According to an embodiment of the present invention, the rare gas is helium.

According to an embodiment of the present invention, the thickness of the area comprising gettering sites ranges between 0.5 μm and 5 μm.

According to an embodiment of the present invention, the gettering sites result from a precipitation of oxygen.

According to an embodiment of the present invention, the area comprising gettering sites extends all the way to the rear surface of the substrate.

According to an embodiment of the present invention, the metal impurities comprise iron atoms.

The foregoing objects, features, and advantages of the present invention will be discussed in detail in the following non-limiting description of specific embodiments in connection with the accompanying drawings.

DETAILED DESCRIPTION

Figure 1:
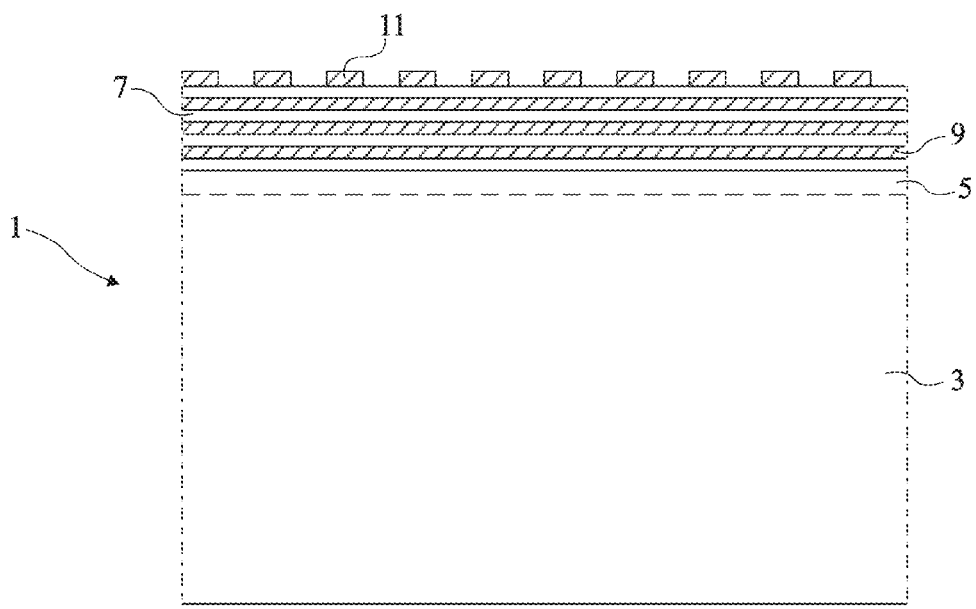
FIG. 1, previously described, is a simplified cross-section view of a portion of an integrated circuit chip.

For clarity, the same elements have been designated with the same reference numerals in the different drawings and, further, as usual in the representation of integrated circuits, the various drawings are not to scale.

An aspect of an embodiment of the present invention is to provide, in the substrate, a protection layer capable of attenuating and of scattering a possible attack laser beam to broaden the beam and to prevent it from reaching a precise area of the active portion. Further, at each point of the chip, the laser power will be decreased.

Figure 2:
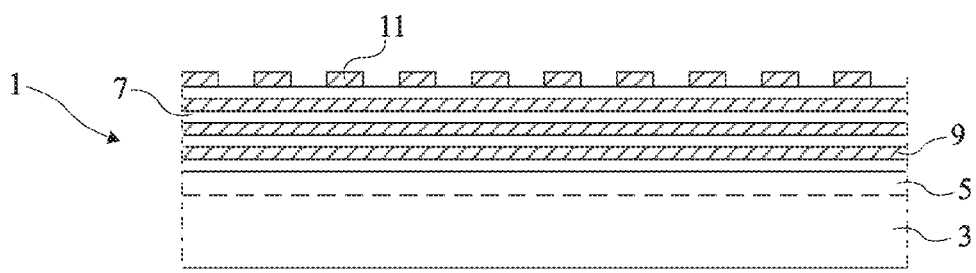
FIG. 2, previously described, is a simplified cross-section view of the chip portion of FIG. 1 after thinning down of its substrate.
Figure 3:
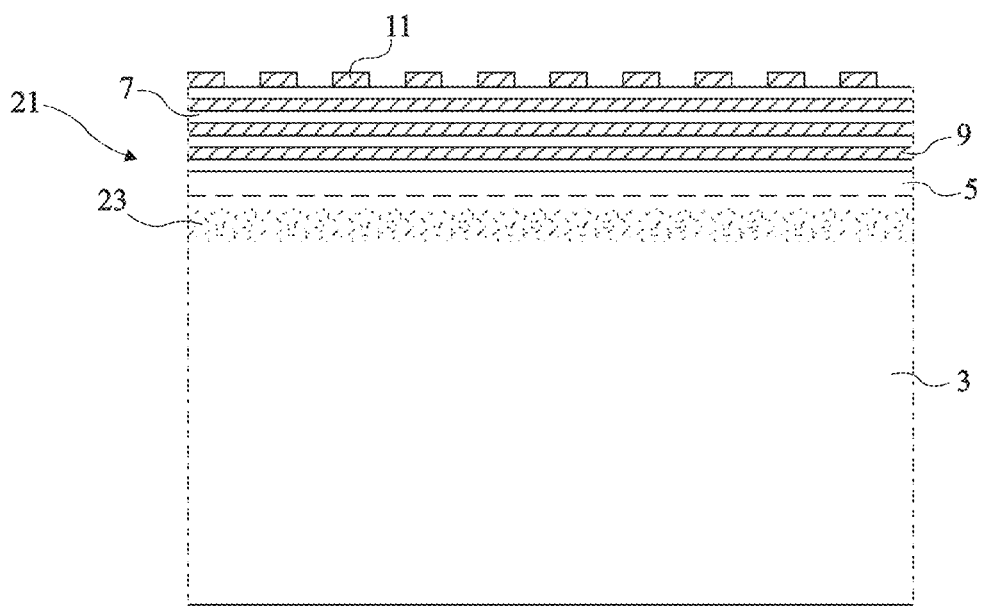
FIG. 3 is a cross-section view schematically showing an embodiment of an integrated circuit chip provided with a system of protection against laser attacks.

FIG. 3 is a cross-section view schematically showing an embodiment of an integrated circuit chip 21 provided with a system of protection against laser attacks. Like chip 1 described in relation with FIG. 2, chip 21 is formed inside and on top of a substrate 3. Substrate 3 comprises, under an active portion 5 in which the chip components are formed, an area 23 capable of scattering a laser beam.

In area 23, gettering sites capable of retaining metal impurities have been formed. Area 23 comprises a strong concentration of intentionally introduced metal impurities, for example, iron, nickel, copper, or gold atoms.

The provision of gettering areas in a semiconductor substrate has been provided to clear the active substrate regions of impurities capable of degrading the performances of certain components. Such gettering areas have the function of retaining possible parasitic impurities introduced into the substrate during the manufacturing, so that these impurities do not contaminate active regions of the substrate. Such techniques are especially used in the field of power semiconductor devices.

An example of a method for forming a gettering area comprises providing, in a local region of the substrate, an implantation at high dose of a rare gas such as helium, argon, or xenon. An adapted consecutive anneal causes the forming of bubbles and/or of dislocations in this region. The defects thus formed happen to be gettering sites capable of retaining possible metal impurities present in the substrate.

After having formed gettering area 23, for example, according to the above-mentioned method, it is provided to intentionally contaminate the substrate, for example, by implantation of iron atoms. The impurities thus introduced concentrate in area 23 and are retained therein. These impurities enable to diffract/scatter/attenuate a possible attack laser beam, thus shielding the components of chip 21.

Contaminated gettering area 23 should be placed at a sufficiently low distance from active layer 5 so that, in the previous thinning step, the attacker cannot remove it without damaging the chip. Currently, active layer 5 in which the chip components are formed has a thickness approximately ranging from 3 µm to 10 µm. After thinning down according to usual techniques, substrate 3 has a thickness on the order of 50 µm. A more significant thinning down would risk to cause an unbalance of the mechanical stress exerted on the chip. The interconnect tracks and vias would especially risk to break, thus making the chip impossible to use.

Thus, as an example, contaminated gettering area 23 may have a thickness approximately ranging from 0.5 µm to 5 µm and be formed, under active area 5, at a distance ranging between 12 µm and 20 µm from the upper surface of substrate 3. However, the present invention is not limited to this specific case. A gettering area extending over almost the entire thickness of substrate 3, from its rear surface to a distance of a few µm, for example approximately ranging from 5 µm to 20 µm, from active layer 5, may, for example, be provided.

Figure 4:
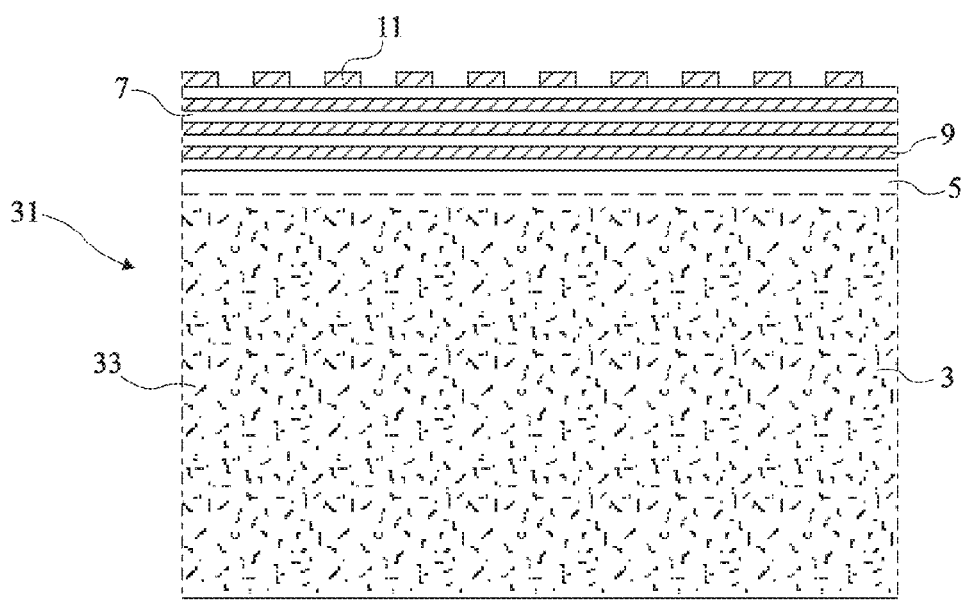
FIG. 4 is a cross-section view schematically showing an alternative embodiment of an integrated circuit chip provided with a system of protection against laser attacks.

FIG. 4 is a cross-section view schematically showing an alternative embodiment of an integrated circuit 31 provided with a system of protection against laser attacks. In this example, as compared with chip 21 described in relation with FIG. 3, thin contaminated gettering area 23 has been replaced with an extensive gettering area 33. Gettering area 33 extends from the rear surface of the substrate all the way to a distance approximately ranging from 5 µm to 20 µm from active area 5.

Chip 31 may, for example, be manufactured inside and on top of a silicon wafer formed according to the "MDZ®" technology (for "Magic Denuded Zone"). Such wafers are especially described in article "Effective intrinsic gettering for 200 mm and 300 mm P/P-wafers in a low thermal budget 0.13 µm advanced CMOS logic process", by M. J. Binns, disclosed in 2002 at the "9$^{th}$ Int. Symp. Silicon Materials Science & Technology, Philadelphia, May 12-17, 2002" Conference, available on website "http://www.memc.com/". Such a wafer indeed comprises, in the substrate, gettering sites previously formed by oxygen precipitation. The sites are distributed across a large part of the substrate thickness, from the rear surface to a few tens of µm away from the front surface. Such sites are capable of concentrating and of retaining possible metal impurities.

A step of intentional contamination of the substrate, for example, by implantation of iron atoms, such as described hereabove, is then provided.

The concentration of metal impurities in area 23 (FIG. 3) or 33 (FIG. 4) will preferably be chosen to be high. This concentration especially depends on the gettering method forming process as well as on the method used to introduce metal impurities into this layer. As an example, in the case of a thin gettering area such as area 23 of FIG. 3, gettering sites may be formed by implantation of helium at 40 keV and $5 \times 10^{16}$ atoms/cm$^2$, followed by an adapted anneal. An implantation of iron atoms through the rear surface of the substrate may consecutively be implemented, at 100 keV and $10^{12}$ atoms/cm$^2$, to obtain a final concentration of iron atoms in area 23 approximately ranging from $10^{17}$ to $10^{18}$ atoms/cm$^3$.

An advantage of the provided protection system is that it compels the attacker to considerably increase, for example by a factor on the order of from 10 to 100, the laser beam power to be able to inject faults into the chip circuits. Accordingly, before the attacker can acquire critical data, the attack will be easily detected by conventional means, for example, temperature variation detectors.

Further, the presence of the contaminated gettering area makes it difficult for the attacker to control the size and the position of the laser beam at the level of the active chip area.

Another advantage of the provided protection system is that it requires no modification of the chip circuits which are desired to be protected, nor any modification of the manufacturing process. Further, the manufacturing steps necessary to form the contaminated gettering area are compatible with usual integrated circuit chip manufacturing methods. The provided system can thus be employed to easily protect any type of circuit, at a lesser cost. Further, such a protection system does not increase the silicon surface area necessary to form the chip.

Specific embodiments of the present invention have been described. Various alterations and modifications will occur to those skilled in the art.

In particular, the present invention is not limited to the use of the metals mentioned hereabove to form the metal impurities concentrated under the active chip portion. It will be within the abilities of those skilled in the art to use any other adapted metal.

Further, a concentration of metal atoms in the gettering area approximately ranging from $10^{17}$ to $10^{18}$ atoms/cm$^3$ has been mentioned hereabove. It will be within the abilities of those skilled in the art to adapt the protection system by using different concentrations. Moreover, the thicknesses and the depths mentioned hereabove for the different layers of an integrated circuit chip and especially for the gettering layer are given as an example only. It will be within the abilities of those skilled in the art to implement the desired operation by using different thicknesses and depths.

Various techniques for forming gettering areas capable of concentrating and of retaining metal impurities introduced into a semiconductor substrate have been mentioned hereabove. The present invention is not limited to these specific examples. It will be within the abilities of those skilled in the art to implement the desired operation whatever the method used to form the gettering area.

Similarly, it has been provided to intentionally contaminate the substrate, after forming of the gettering area, by implantation of metal atoms. It will be within the abilities of those skilled in the art to implement the desired operation whatever the method used to introduce metal impurities at the desired concentration in the gettering area.

A system of protection of an integrated circuit chip against laser attacks has been described hereabove, this system comprising a gettering area in which metal impurities have been intentionally introduced. However, other applications to the provision of such a contaminated gettering area may be provided. Thus, the present invention aims at an integrated circuit chip comprising a gettering area, extending under the active portion of the chip, at a short distance from the active portion, and comprising a strong concentration of metal impurities.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit chip formed inside and on top of a semiconductor substrate and comprising:
    in an upper portion of the substrate, an active portion in which components are formed; and
    under the active portion and at a depth ranging between 5 and 50 μm from an upper surface of the substrate, an area comprising sites for gettering metal impurities and containing metal atoms at a concentration ranging between $10^{17}$ and $10^{18}$ atoms/cm$^3$.

2. The chip of claim 1, wherein the gettering sites result from an implantation of a rare gas followed by an anneal.

3. The chip of claim 2, wherein the rare gas is helium.

4. The chip of claim 2, wherein the thickness of said area ranges between 0.5 μm and 5 μm.

5. The chip of claim 1, wherein the gettering sites result from a precipitation of oxygen.

6. The chip of claim 5, wherein said area extends all the way to the rear surface of the substrate.

7. The chip of claim 1, wherein the metal impurities comprise iron atoms.

8. A circuit comprising:
    a substrate, the substrate having a first side and a second side opposite the first side;
    an active layer formed on the first side of the substrate; and
    a gettering area formed in the substrate, the gettering area being located in the substrate at a depth ranging between 5 and 50 μm from the first side of the substrate, the gettering area comprising metal impurities at a concentration between $10^{17}$ and $10^{18}$ atoms/cm$^3$.

9. The circuit of claim 8, wherein a thickness of the gettering area is between 0.5 μm and 5 μm.

10. The circuit of claim 8, wherein the gettering area extends through a thickness of the substrate between the depth between 5 and 50 μm and the second side of the substrate.

11. The circuit of claim 8, wherein the gettering area comprises metal impurities at a concentration sufficient to scatter a laser beam.

12. A circuit comprising:
    a first surface;
    a second surface;
    an active layer comprising at least one functional component and formed between the first surface and the second surface;
    at least one interconnect track formed between the first surface and the active layer; and
    a protection layer formed between the active layer and the second surface, the protection layer comprising a semiconductor layer, the semiconductor layer having defects in a structure of the semiconductor layer, at least some of the defects in the structure having metal impurities located therein such that the protection layer comprises metal impurities at a concentration greater than $10^{13}$ atoms/cm$^3$.

13. The circuit of claim 12, wherein at least a portion of the semiconductor layer of the protection layer that includes the defects forms a gettering area of the circuit.

14. The circuit of claim 12, wherein the concentration of the metal impurities in the protection layer is between $10^{17}$ and $10^{18}$ atoms/cm$^3$.

15. The circuit of claim 12, wherein the defects in the structure of the semiconductor layer of the protection layer are formed in the protection layer beginning at a distance between 5 and 50 μm from the active layer.

16. The circuit of claim 12, wherein:
    the circuit further comprises a substrate;
    the active layer is formed on a first side of the substrate;
    the protection layer is formed in the substrate; and
    the defects in the structure of the semiconductor layer of the protection layer begin at a depth between 5 and 50 μm from the first side of the substrate.

17. The circuit of claim 16, wherein the defects in the structure of the semiconductor layer of the protection layer are formed in the protection layer extending from the depth between 5 and 50 μm from the first side of the substrate and through the thickness of the substrate to the second side.

18. The circuit of claim 12, wherein a thickness of a portion of the protection layer that includes the defects in the structure of the semiconductor layer is between 0.5 μm and 5 μm.

19. A circuit comprising:

a first surface;

a second surface;

an active layer comprising at least one functional component and formed between the first surface and the second surface;

at least one interconnect track formed between the active layer and the first surface; and means for preventing a laser impinging on the second surface from affecting operations of the active layer, the means for preventing being formed between the active layer and the second surface, wherein the means for preventing comprises metal impurities at a concentration between $10^{17}$ and $10^{18}$ atoms/cm$^3$.

20. The circuit of claim 19, wherein the means for preventing a laser from affecting operations of the active layer comprises means for scattering a laser beam.

21. The circuit of claim 19, wherein:

the active layer is formed on a substrate; and the means for preventing is formed in the substrate.

22. The circuit of claim 12, wherein the concentration of the metal impurities in the protection layer is greater than $10^{15}$ atoms/cm$^3$.

23. The circuit of claim 22, wherein the concentration of the metal impurities in the protection layer is less than $10^{18}$ atoms/cm$^3$.

24. The circuit of claim 12, wherein the concentration of the metal impurities in the protection layer is greater than $10^{17}$ atoms/cm$^3$.

25. The circuit of claim 12, wherein the concentration of the metal impurities in the protection layer is less than $10^{18}$ atoms/cm$^3$.

* * * * *